United States Patent
Celauro

(10) Patent No.: US 6,459,036 B1
(45) Date of Patent: Oct. 1, 2002

(54) CASCADED INERT GAS PURGING OF DISTRIBUTED OR REMOTE ELECTRONIC DEVICES THROUGH INTERCONNECTED ELECTRICAL CABLING

(75) Inventor: Paul J. Celauro, Free Bridges, NJ (US)

(73) Assignee: The BOC Group, Inc., Murray Hill, NJ (US)

( * ) Notice: Subject to any disclaimer, the term of this patent is extended or adjusted under 35 U.S.C. 154(b) by 0 days.

(21) Appl. No.: 09/710,271

(22) Filed: Nov. 10, 2000

(51) Int. Cl.[7] .................................................. H05K 5/00
(52) U.S. Cl. ............................. 174/17 GF; 174/17 VA
(58) Field of Search ..................... 174/17 GF, 17 VA, 174/50, 11 R; 220/4.02

(56) References Cited

U.S. PATENT DOCUMENTS

| | | | |
|---|---|---|---|
| 1,933,312 A | * | 10/1933 | Clark ......................... 174/11 R |
| 1,969,721 A | * | 8/1934 | Bennett ..................... 174/11 R |
| 2,403,340 A | * | 7/1946 | Camilli .............. 174/17 VA X |
| 3,571,486 A | | 3/1971 | Kennedy |
| 4,048,807 A | | 9/1977 | Ellers et al. |
| 4,698,456 A | | 10/1987 | Hamacher |
| 5,191,173 A | | 3/1993 | Sizer et al. |
| 5,603,892 A | | 2/1997 | Grilletto et al. |
| 5,685,360 A | | 11/1997 | Bizzio |
| 5,868,154 A | * | 2/1999 | Jones .......................... 137/202 |
| 6,034,318 A | | 3/2000 | Lycke et al. |
| 6,075,204 A | * | 6/2000 | Celauro et al. ......... 174/17 GF |

* cited by examiner

Primary Examiner—Anthony Dinkins
Assistant Examiner—Dhiru R Patel
(74) Attorney, Agent, or Firm—Joshua L. Cohen; Salvatore P. Pace

(57) ABSTRACT

The present invention is a system for protecting electronic, mechanical, or other components from contamination which includes a distribution manifold, a pressurized gas in fluid communication with the manifold; and a plurality of apparatuses which are capable of enclosing at least one electronic device, wherein the apparatuses are individually connected to the manifold by a conduit; the conduit having a first end and a second end, wherein the first end is connected to the manifold and the second end is connected to the apparatus.

18 Claims, 4 Drawing Sheets

CASCADED INERT GAS PURGING OF DISTRIBUTED OR REMOTE ELECTRONIC DEVICES THROUGH INTERCONNECTED ELECTRICAL CABLING

FIELD OF THE INVENTION

The present invention relates to a system for protecting electronic components. More particularly, the present invention relates to a system for protecting electronic components from harsh environmental conditions that may exist in various industrial applications.

BACKGROUND OF THE INVENTION

The importance of controlling and monitoring production processes using electronic devices and instrumentation requires at times, that the electronic instrumentation be located in the production environment. This places the electronic instrumentation in surroundings that may be harsh and this can often have a hazardous effect on the electronic components that they may not be capable of withstanding. For example, the electronic devices may be placed in a process that normally sustains saturation humidity that, over time, can severely damage and incapacitate the electronic components, if they are not properly protected.

Another problem occurs during plant cleaning or disinfection, which may require that the equipment used be cleaned with high pressure hot water. Water pressures greater than 600 psi may be used to clean equipment. This can be fatal to the electronic monitoring and control systems situated nearby. Such water pressures can easily penetrate most common rated electronic enclosures resulting in damage to the electronic circuitry contained within.

To overcome the problem, electronic components have been placed in hermetically sealed chambers that are designed to be waterproof. This technique is described in U.S. Pat. No. 6,075,204 to Celauro et al. This waterproof enclosure has proven successful under severely harsh conditions. The above-mentioned enclosure prevents condensation from forming inside the waterproof enclosure as the outside temperature decreases, eliminating damage to the electronics within. However, this system does not make a direct provision for the hermetically isolated satellite sensors connected to the system. Thus, the sensors are still subject to the same harsh environment, unless they are independently purged with a dry gas.

U.S. Pat. No. 5,603,892 to Grilletto et al. provides a gas purged electronics enclosure in which a control system is used to open and close valves in order to purge a contaminant-free gas through the electronics enclosure. In addition, a getter material is used as a scavenger to ensure the removal of contaminants. This patent describes a system that has only one enclosure for housing electronic components.

These prior art attempts do not provide a suitable and economical solution for protecting electronic devices that may be located in various places throughout a process and may be interconnected. What is needed is an integrated system that is capable of protecting these multiple interconnected electronic devices.

The present invention is an integral cascaded distributed purge system used to protect interconnected electronic components. The system is particularly useful in industrial applications where the surrounding environment can adversely affect electronic components. For example, in a food plant, cleaning procedures require that hot water and steam be used to wash down equipment. This creates an atmosphere where moisture can inadvertently enter into a sealed enclosure, ultimately leading to electronic failures. By installing the distributed purge gas system of the present invention, electronic devices located at different points in a process are protected by an integrated system that continuously purges pressurized gas through the system. This is accomplished in an efficient and cost effective manner, i.e. through already existing interconnecting cabling and fixtures.

SUMMARY OF THE INVENTION

The present invention provides a system that protects electronic components from the outside environment by means of continuously flowing pressurized gas through the system.

The system is capable of providing protection to the entire system of separately housed electronic devices from a single highly reliable source.

Accordingly, the present invention is a system for protecting electronic components from contamination, which comprises a tightly controlled, multi-tiered distribution means; a pressurized gas in fluid communication with the distribution means; a plurality of apparatuses for enclosing electronic devices connected to the distribution means; and each apparatus connected to the distribution means by a conduit having a first end and a second end, wherein the first end is connected to the distribution means and the second end is connected to the apparatus.

The present invention also includes a method of protecting electronic devices from contamination comprising the steps of: (a) enclosing at least one electronic device in an integrated distributed purge gas system comprising: (i) a distribution means, (ii) a pressurized gas in fluid communication with the distribution means, and (iii) a plurality of apparatuses which are capable of enclosing at least one electronic device, wherein the apparatuses are individually connected to the distribution means by means of a conduit, the conduit having a first end and a second end, wherein the first end is connected to the distribution means and the second end is connected to the apparatus; (b) continuously supplying to the system the pressurized gas; (c) maintaining a positive pressure within the system; (d) controlling flow and pressure very carfully at each stage; (e) continuously venting a portion of the pressurized gas; and (f) controlling the system to provide the precise amounts of gas necessary to enable the benefits of the system, while also preventing large amounts of purge gas from entering the plant environment in the event of multiple system failures.

DETAILED DESCRIPTION OF THE PREFERRED EMBODIMENT

Figure 1:
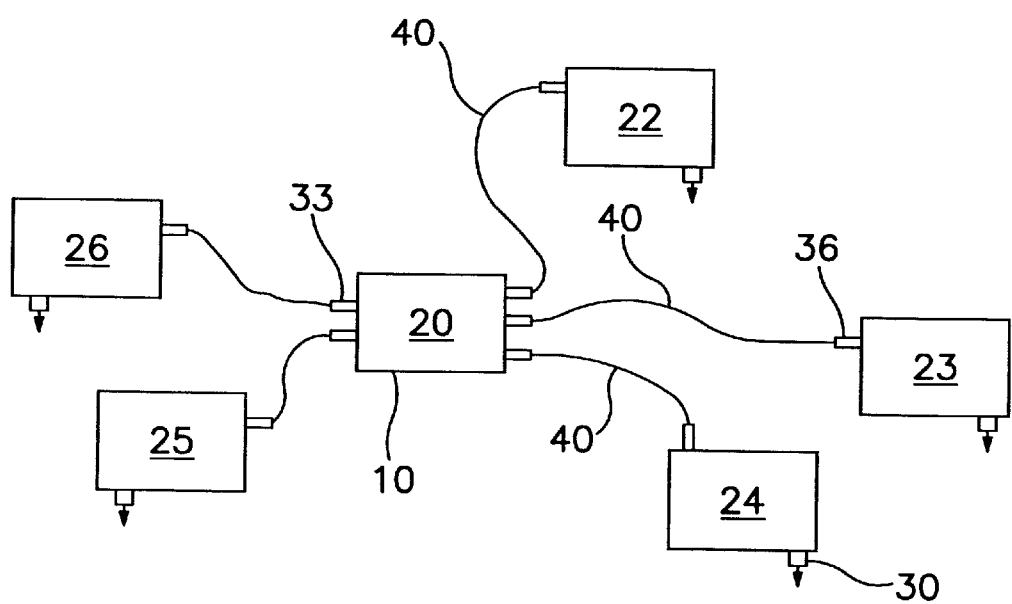
FIG. 1 is a schematic representation of a preferred embodiment of a distribution purge system of the present invention.

In FIG. 1, electronic components are protected in a distributed purge gas system, where pressurized gas 10 flows into a distribution means such as distribution manifold 20. The distribution manifold distributes the pressurized gas through a conduit such as cable 40 to apparatuses 22, 23, 24, 25, and 26, which house the electronic components at different locations along the process. Each apparatus is designed with a pressure or flow control means such as check valve 30. This allows the system to continuously purge pressurized gas through each apparatus serially or in parallel by continuously venting or bleeding a portion of the pressurized gas through the check valve. The check valve is set to open and release the pressurized gas at a predetermined pressure setpoint. Typically, the check valve will continuously control the pressurized gas at a pressure about 1 to 2 psi above the next level in the flow cascade. In the case of the last apparatus in the flow cascade (exhaust to atmosphere), the check valve will typically hold the internal pressure of the final apparatus about 0.5 to 1 psi above the surroundings.

Figure 2:
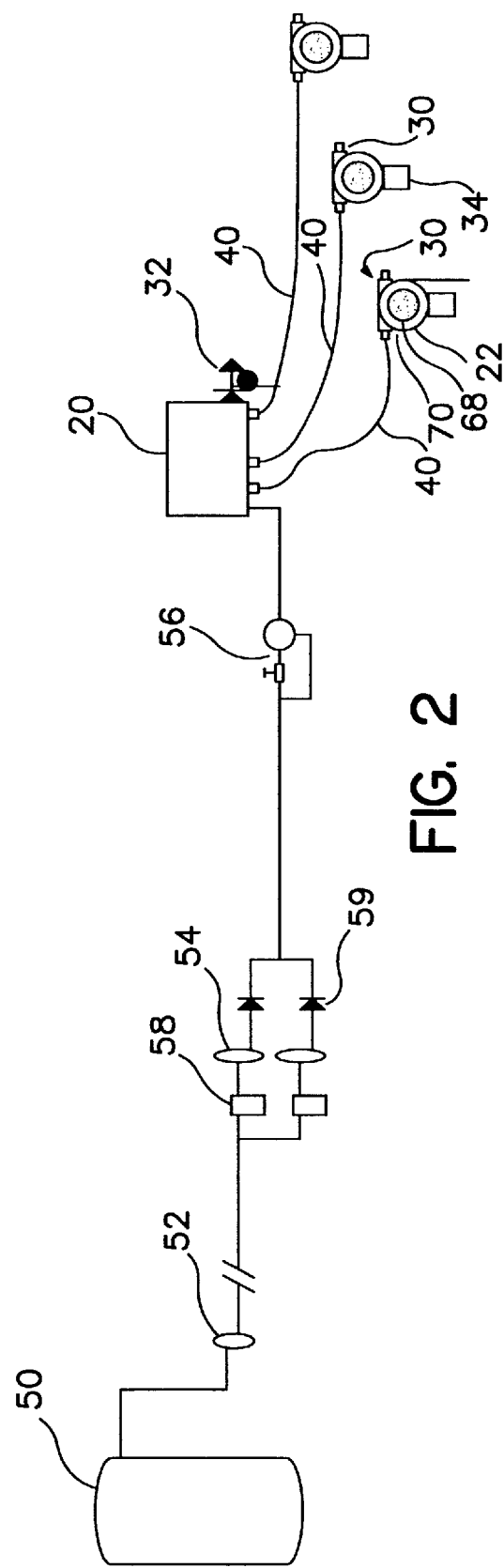
FIG. 2 is a schematic representation of another embodiment of a distributed purge system of the present invention.

FIG. 2 shows another embodiment of a distributed purge system of the present invention where pressurized gas is supplied from supply tank 50 and filtered to remove contaminants and moisture through filter 58. The pressure of the pressurized gas is decreased through a series of pressure regulating valves 52 and 54. For example, pressurized gas from the supply tank may be about 45 psi. The pressure is reduced to 35 psi by pressure regulating valve 52 and then reduced to 30 psi by pressure regulating valve 54. Differential flow control module 56 modulates the pressure of its effluent pressurized gas to control the flow of the pressurized gas into distribution manifold 20. For example, pressurized gas at about 30 psi may be continuously modulated at about 2 psi at the effluent of the differential flow control module. The pressurized gas is shown flowing continuously through conduit 40 into the apparatuses, such as apparatus 22 and out through check valve 30, which is shown in detail in FIG. 3. In addition, the apparatuses are shown with a sensing means attached, such as sensor 34, which is optionally part of an independent industrial automatic control system.

Integration of more than one apparatus to a distribution means increases the efficiency and cost effectiveness of this system. The carefully controlled pressurized gas-sharing arrangement minimizes the number of separate pressurized gas supply sources that are needed by doing away with the closed system arrangement used in the prior art where each electronic device is housed in its own system, thereby greatly increasing complexity and material costs. The system of the present invention easily and capably maintains pressure in the system by controlling, via cascade, the flow of the pressurized gas through a multitude of apparatuses that house electronic devices in the system, utilizing cracking pressures of the check valves installed in each apparatus to apportion the flow. While the system depicted in FIG. 2 depicts a single distribution means, it should be understood that the present invention can be readily configured with an infinite number of distribution means without compromising the effectiveness or efficiency of the system.

Apparatuses 22, 23, 24, 25, and 26 are shown in FIG. 1. However, it should be understood that the present invention will provide protection for one or any number of cascaded levels of purged enclosures. This protection is achieved because the present system utilizes the existing cascaded electrical connectivity of the distributed electronics system to distribute the purge gas as well.

The distribution means may be any suitable device that is capable of distributing pressurized gas 10 to each apparatus, which houses an electronic device. Preferably, the distribution means is hermetically sealed to reduce the possibility of contaminants from entering the system and to maintain a positive pressure within the system. It should be noted that the hermetic seal by itself may not be sufficient in preventing moisture, i.e. steam or condensate, from entering or forming in the distribution means. By continuously purging the system with pressurized gas, the gas in the system is constantly changing, thus decreasing the chance of moisture collection and formation. In addition, a pressure control device such as check valve 32 shown in FIG. 2, may optionally be attached to the distribution means to assist in adjusting the flow of the pressurized gas. Non-limiting examples of the distribution means include boxes, enclosures, electrical panels, manifolds, pipes, tubes, electrical cables and conduits, and intermediate storage canisters or tanks.

Preferably, pressurized gas 10 can be any inert gas source. For the purposes of the present invention, the term "inert gases" is intended to mean any gas that will not react with, and in the environment created within, the apparatus or system. For example, nitrogen, helium, or instrumentation air of relatively high purity with minimal moisture content, are some of the many inert gases that may be used. Preferably, the pressurized gas is superdried compressed air having a dewpoint of about −400°F.

The system of the present invention has two or more apparatuses for housing electronic components, which provide one layer of protection from the outside environment. The apparatus for enclosing the electronic devices preferably comprises: (a) a first enclosure 68 for housing one or more electronic devices having a plurality of walls having at least one vent through one of said plurality of walls; (b) a second enclosure 70 having a plurality of walls for surrounding said first enclosure and having a flow control means 30 adapted to permit gas to exit the second enclosure after the pressure inside the second enclosure exceeds a predetermined value; (c) a means for spacing apart said first enclosure and the second enclosure wherein the pressurized gas flows through the first enclosure and into the second enclosure so that a positive flow of purge gas circulates around the electronic devices and exits the first enclosure at the vent; and (d) a means for electronically connecting the enclosed electronic devices with an electronic circuit external to the first and second enclosures. Preferably, the flow control means will permit gas to exit the apparatus when the predetermined value is about 1 psi.

Figure 4:
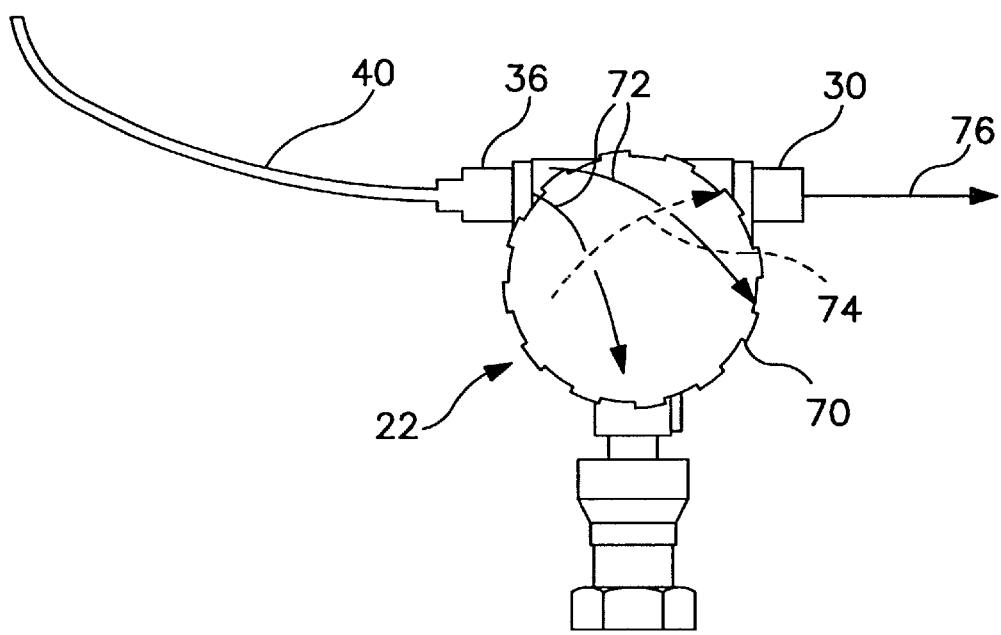
FIG. 4 is a schematic representation of an apparatus for enclosing electronic devices according to the present invention.

The apparatus shown in FIG. 4 demonstrates one example of an apparatus for enclosing the electronic devices. Pressurized gas 72 is distributed to apparatus 22 via cable 40, which is connected to apparatus 22 by receptacle 36. Pressurized gas 72 circulates around the electronic devices contained within housing 70. Upon reaching the predetermined pressure, pressurized gas 74 exits housing 70 through check valve 30 and exhausts to the atmosphere 76.

Figure 3:
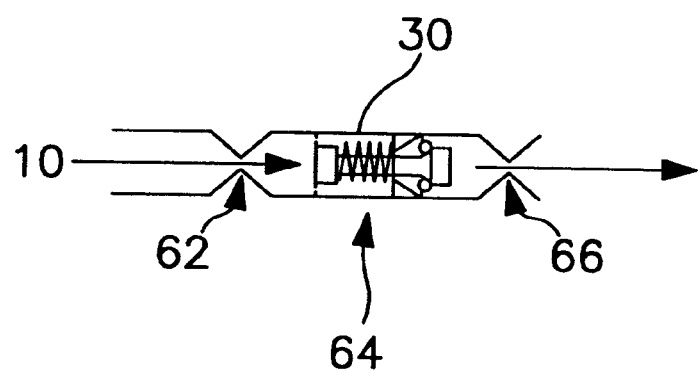
FIG. 3 is a schematic representation of a check valve that functions as a flow control means in a preferred embodiment of the present invention.

Check valve 30 shown in FIG. 3 demonstrates one example of a device that is capable of providing flow control by modulating upstream pressure. Pressurized gas 10 flows into the check valve from the electronics or other enclosure, first passing through fixed restriction zone 62, then into the variable restriction zone 64. The variable restriction zone is shown as a spring mechanism, which opens the check valve when the pressure exceeds a predetermined value. The pressurized gas then passes through a second fixed restriction zone 66 and then exits the check valve. However, any device that can control the flow of a pressurized gas may be used. Particularly preferred is a ball and spring type, or diaphragm actuated, check valve. The flow control means may be located through any exterior surface of the outer enclosure of the apparatus in order to allow pressurized gas 10 to flow from the inside of the outer enclosure after the internal pressure exceeds about 0.5 to 1.0 psi.

The pressurized gas flows through conduits 40, into their respective apparatus. Each apparatus is connected to the distribution means via its own conduit 40. Any conduit may be used for this purpose as long as it is capable of handling pressurized gas flow. Generally, conduit 40 will additionally be used to hold electrical cables and wires. For example, any form of tubing may be used, pipes, plastics, cables, or the like are suitable conduits. Typically, each conduit 40 has a first end such as receptacle 33 that is connected to the distribution means and a second end such as receptacle 36 that connects to the apparatus. The receptacles are preferably impervious to water and do not allow the gas to escape the system. In a preferred embodiment of the present invention, Turck, Inc. PIN FS 4.4-0.5/14.5 microstyle DC receptacles are used. In the preferred embodiment, the receptacles are multi-pin male connectors, which are mated to molded female connectors having shielded cables for connection of the electronic circuitry internal to the enclosure to a central computer or other external electronics.

In addition the present invention includes a method of protecting electronic devices from contaminants, comprising the steps of: (a) enclosing at least one electronic device in an integrated distributed purge gas system comprising: (i) a distribution means, (ii) a pressurized gas in fluid communication with the distribution means, and (iii) a plurality of apparatuses which are capable of enclosing at least one electronic device, wherein the apparatuses are individually connected to the distribution means by means of a conduit, the conduit having a first end and a second end, wherein the first end is connected to the distribution means and the second end is connected to the apparatus; (b) continuously supplying to the system the pressurized gas; (c) maintaining a positive pressure within the system; (d) distributing the gas to all enclosures via a cascade pressure flow system; and (e) continuously venting a portion of the pressurized gas.

Although the present invention is typically used in wet, humid environments, it should be understood that it may be used in any challenging environment, wherein it is desirable to prevent contaminants from entering an electronic apparatus.

The present invention has been described with particular reference to the preferred forms thereof. It will be obvious to one of ordinary skill in the art that changes and modifications may be made therein without departing from the spirit and scope of the present invention as defined by the following claims.

What is claimed is:

1. A system for protecting electronic components from contamination comprising:
    distribution means;
    a pressurized gas in fluid communication with said distribution means;
    a plurality of apparatuses each of which is capable of enclosing at least one electronic component, each one of said apparatuses individually connected to said distribution means by a conduit having a first end and a second end, wherein said first end is connected to said distribution means and said second end is connected to said apparatus, said apparatus comprising:
        a first enclosure for housing said at least one electronic component and having a plurality of walls having at least one vent through one of said plurality of walls,
        a second enclosure having a plurality of walls spaced apart from said first enclosure for surrounding said first enclosure and having a flow control means adapted to permit said pressurized gas to exit said second enclosure after the pressure inside said second enclosure exceeds a predetermined value, wherein said pressurized gas flows through said second enclosure and into said first enclosure for a positive flow of purge gas to circulate around said at least one electronic component and exit said first enclosure at said vent; and
    means for electrically connecting said at least one electronic component with an electronic circuit external to said first and second enclosures.

2. The system of claim 1, wherein said flow control means is a check valve.

3. The system of claim 1, wherein said predetermined value is about 1 psi.

4. The system of claim 1, wherein said apparatus further comprises a sensing and control means for modulating the pressure inside said apparatus.

5. The system of claim 1, further comprising an automatic control means for maintaining positive pressure in said system.

6. The system of claim 5, wherein said pressurized gas contains substantially no water vapor.

7. The system of claim 1, wherein said pressurized gas is selected from the group consisting of: nitrogen, superdried compressed air, instrumentation air, and mixtures thereof.

8. The system of claim 1, wherein said pressure in said system is about 2 psi or less.

9. The system of claim 1, wherein said pressurized gas is filtered to remove impurities and moisture.

10. The system of claim 1, wherein said distribution device is a manifold.

11. The system of claim 1, wherein said pressurized gas flows continuously through said flow control means.

12. The system of claim 1, wherein said pressure at said flow control means is between about 1 to 2 psi.

13. A method of protecting electronic devices from contamination comprising the steps of:
    (a) enclosing at least one electronic device in an integrated distributed purge gas system comprising: (i) distribution means, (ii) a pressurized gas in fluid communication with said distribution means, and (iii) a plurality of apparatuses each of which is capable of enclosing said at least one electronic device, each one of said apparatuses individualy connected to said distribution means by a conduit having a first end and a second end, wherein said first end is connected to said distribution means and said second end is connected to said apparatus, said apparatus comprising:
        a first enclosure for housing said at least one electronic device having a plurality of walls having at least one vent through one of said plurality of walls,
        a second enclosure having a plurality of walls spaced apart from said first enclosure for surrounding said first enclosure and having a flow control means adapted to permit said pressurized gas to exit said second enclosure after the pressure inside said second enclosure exceeds a predetermined value, wherein said pressurized gas flows through said second enclosure and into said first enclosure for a positive flow of purge gas to circulate around said at least one electronic device and exit said first enclosure at said vent, and
        means for electrically connecting said at least one electronic device with an electronic circuit external to said first and second enclosures;

(b) continuously supplying said pressurized gas to said system;

(c) maintaining a positive pressure within said system; and (d) continuously venting a portion of said pressurized gas.

14. The method of claim 13, wherein said pressurized gas is selected from the group consisting of: nitrogen, superdried compressed air, instrumentation air, and mixtures thereof.

15. The method of claim 13, wherein said pressurized gas contains substantially no water vapor.

16. The method of claim 13, wherein the pressure in said gas system is about 2 psi or less.

17. The method of claim 13, wherein said apparatus further comprises sensing means for monitoring said pressure inside said apparatus.

18. The method of claim 13, wherein said gas system further comprises an automatic control means for maintaining a constant positive pressure in said system.

* * * * *